(12) United States Patent
Ahn et al.

(10) Patent No.: US 11,064,276 B2
(45) Date of Patent: Jul. 13, 2021

(54) PANEL BOTTOM MEMBER AND DISPLAY DEVICE INCLUDING THE SAME

(71) Applicant: Samsung Display Co. Ltd., Yongin-si (KR)

(72) Inventors: Yi Joon Ahn, Seoul (KR); Sung Chul Kim, Seongnam-si (KR); Jung Hun Noh, Yongin-si (KR); Keun Kyu Song, Seongnam-si (KR); Hye Yong Chu, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/941,572

(22) Filed: Mar. 30, 2018

(65) Prior Publication Data
US 2019/0014402 A1   Jan. 10, 2019

(30) Foreign Application Priority Data
Jul. 6, 2017 (KR) .................. 10-2017-0085910

(51) Int. Cl.
| | | |
|---|---|---|
| *H04R 1/02* | (2006.01) | |
| *H04R 7/04* | (2006.01) | |
| *H01L 51/52* | (2006.01) | |
| *H01L 27/32* | (2006.01) | |
| *H05K 5/00* | (2006.01) | |

(Continued)

(52) U.S. Cl.
CPC ......... *H04R 1/028* (2013.01); *H01L 27/3225* (2013.01); *H01L 51/524* (2013.01); *H01L 51/529* (2013.01); *H01L 51/5253* (2013.01); *H01L 51/5281* (2013.01); *H04R 7/04* (2013.01); *H04R 17/00* (2013.01); *H05K 5/0017* (2013.01);

(Continued)

(58) Field of Classification Search
CPC . H04R 1/028; H04R 7/04; H04R 7/16; H04R 17/00; H04R 2499/15; H01L 27/3225; H01L 27/323; H01L 51/524; H01L 51/5253; H01L 51/5281;

(Continued)

(56) References Cited

U.S. PATENT DOCUMENTS

| | | |
|---|---|---|
| 8,934,228 B2 | 1/2015 | Franklin et al. |
| 9,317,063 B2 | 4/2016 | Kwon et al. |

(Continued)

FOREIGN PATENT DOCUMENTS

| | | |
|---|---|---|
| CN | 104122557 | 10/2014 |
| CN | 104218057 | 12/2014 |

(Continued)

OTHER PUBLICATIONS

Chinese Office Action—Chinese Application No. 201810708041.4 dated Oct. 12, 2020, citing references listed within.

*Primary Examiner* — Ahmad F. Matar
*Assistant Examiner* — Sabrina Diaz
(74) *Attorney, Agent, or Firm* — Cantor Colburn LLP

(57) ABSTRACT

A panel bottom member includes a light absorbing member, a top bonding layer which is positioned at the top of the light absorbing member, a first vibration sound element which is positioned below the light absorbing member and bonded to the light absorbing member, a buffer member which is positioned below the light absorbing member and does not overlap with the first vibration sound element, and an interlayer bonding layer which is positioned between the light absorbing member and the buffer member.

22 Claims, 14 Drawing Sheets

(51) Int. Cl.
  *H05K 7/20* (2006.01)
  *H04R 17/00* (2006.01)
  *H05K 9/00* (2006.01)
  *H01L 51/00* (2006.01)
  *H04R 7/16* (2006.01)
  *H04R 7/06* (2006.01)

(52) U.S. Cl.
  CPC ....... *H05K 7/20963* (2013.01); *H05K 9/0054* (2013.01); *H01L 27/323* (2013.01); *H01L 51/0097* (2013.01); *H01L 2251/5338* (2013.01); *H04R 7/045* (2013.01); *H04R 7/06* (2013.01); *H04R 7/16* (2013.01); *H04R 2400/11* (2013.01); *H04R 2499/15* (2013.01)

(58) Field of Classification Search
  CPC ............... H01L 51/529; H01L 51/0097; H01L 2251/5338; H05K 5/0017; H05K 7/20963
  USPC ......................................... 381/333, 87, 388
  See application file for complete search history.

(56) References Cited

U.S. PATENT DOCUMENTS

| | | | |
|---|---|---|---|
| 10,386,967 B2 | 8/2019 | Lee et al. | |
| 2013/0272557 A1* | 10/2013 | Ozcan | H04R 1/02 381/333 |
| 2014/0334078 A1* | 11/2014 | Lee | H04M 1/03 361/679.01 |
| 2014/0353623 A1 | 12/2014 | Yi et al. | |
| 2014/0357321 A1 | 12/2014 | Yliaho et al. | |
| 2015/0016650 A1* | 1/2015 | Kim | H04N 21/8106 381/333 |
| 2015/0131821 A1* | 5/2015 | Iwasaki | H01L 41/0973 381/190 |
| 2015/0185963 A1 | 7/2015 | Lee et al. | |
| 2015/0255758 A1* | 9/2015 | Hirai | H01L 51/0024 438/28 |
| 2017/0115758 A1* | 4/2017 | Lee | G06F 3/044 |
| 2017/0300736 A1* | 10/2017 | Song | G06K 9/0004 |
| 2018/0373913 A1* | 12/2018 | Panchawagh | G01S 15/8925 |
| 2019/0324596 A1 | 10/2019 | Lee et al. | |

FOREIGN PATENT DOCUMENTS

| | | |
|---|---|---|
| CN | 104427443 | 3/2015 |
| CN | 104751743 | 7/2015 |
| KR | 1020140132167 | 11/2014 |
| KR | 1020150031641 | 3/2015 |

* cited by examiner

PANEL BOTTOM MEMBER AND DISPLAY DEVICE INCLUDING THE SAME

This application claims priority to Korean Patent Application No. 10-2017-0085910, filed on Jul. 6, 2017, and all the benefits accruing therefrom under 35 U.S.C. § 119, the content of which in its entirety is herein incorporated by reference.

BACKGROUND

1. Field

Exemplary embodiments of the invention relate to a panel bottom member and a display device including the same.

2. Description of the Related Art

Electronic appliances such as a smart phone, a digital camera, a notebook computer, a navigation system, and a smart television ("TV"), which provide images to a user, generally include a display device for displaying an image. The display device includes a display panel for generating and displaying an image and a panel bottom member disposed below the display panel. The panel bottom member includes various functional sheets for protecting the display panel from heating, external shock, and the like.

SUMMARY

A display device only has a function of displaying images and has a disadvantage of desiring a separate speaker in the electronic appliance in order to provide a sound.

Exemplary embodiments may be related to a panel bottom member to which a vibration sound element is bonded.

Exemplary embodiments may be related to a display device to which a vibration sound element is bonded.

An exemplary embodiment may be related a panel bottom member. The panel bottom member includes a light absorbing member, a top bonding layer which is positioned on the light absorbing member, a first vibration sound element which is positioned below the light absorbing member and bonded to the light absorbing member, a buffer member which is positioned below the light absorbing member and does not overlap with the first vibration sound element, and an interlayer bonding layer which is positioned between the light absorbing member and the buffer member.

An exemplary embodiment may be related a display device. The display device includes a display panel, and a panel bottom member disposed below the display panel, where the panel bottom member includes a light absorbing member positioned below the display panel, a top bonding layer which is positioned between the light absorbing member and the display panel and attached to an upper surface of the light absorbing member and a lower surface of the display panel, a first vibration sound element which is positioned below the light absorbing member and bonded to the light absorbing member, a buffer member which is positioned below the light absorbing member and does not overlap with the first vibration sound element, and an interlayer bonding layer positioned between the light absorbing member and the buffer member.

An exemplary embodiment may be related a display device. The display device includes a display panel including an upper surface displaying an image and a lower surface which is an opposite surface of the upper surface, a light absorbing member bonded to the lower surface of the display panel, and a vibration sound element bonded to the lower surface of the display panel, where the vibration sound element overlaps with the light absorbing member.

The invention is not limited to the aforementioned embodiments, and other exemplary embodiments, which are not mentioned above, will be apparent to a person having ordinary skill in the art from the following description.

Details of other exemplary embodiments will be included in the detailed description of the invention and the accompanying drawings.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
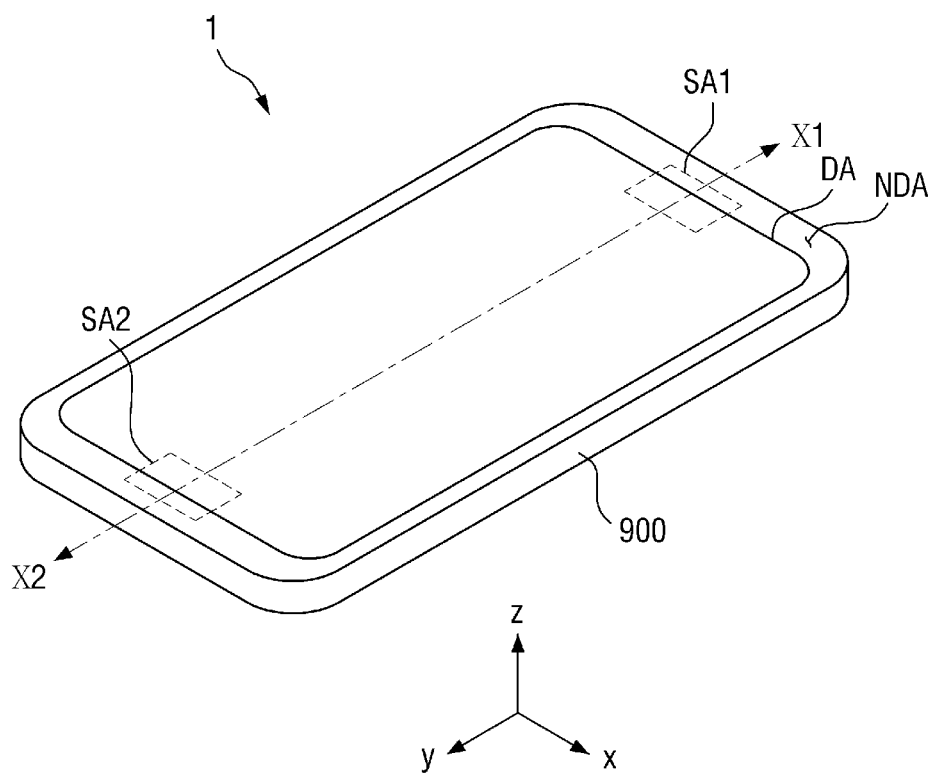
FIG. 1 is a perspective view of an exemplary embodiment of a display device according to the invention.

Features of the invention and methods of accomplishing the same may be understood more readily by reference to the following detailed description of embodiments and the accompanying drawings. The invention may, however, be embodied in many different forms and should not be construed as being limited to the exemplary embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper", and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the drawings, components may be exaggerated or reduced in size for convenience of explanation.

Throughout the specification, like reference numerals refer to like elements.

Hereinafter, exemplary embodiments of the invention will be described in detail with reference to the accompanying drawings.

Figure 2:
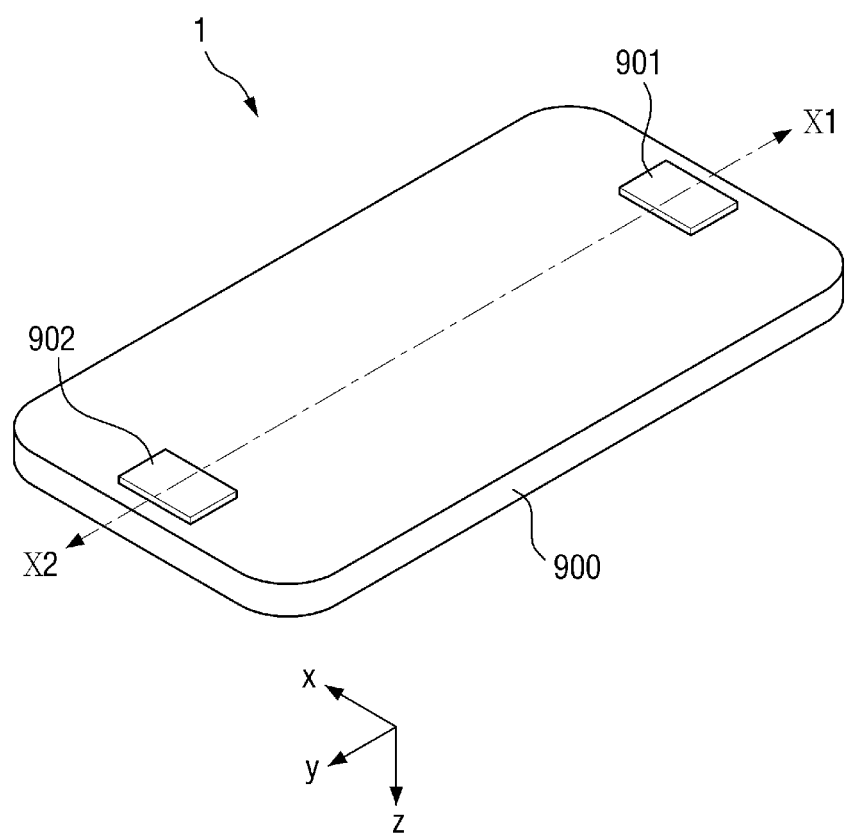
FIG. 2 is a perspective view illustrating a bracket bottom side of the display device illustrated in FIG. 1.
Figure 3:
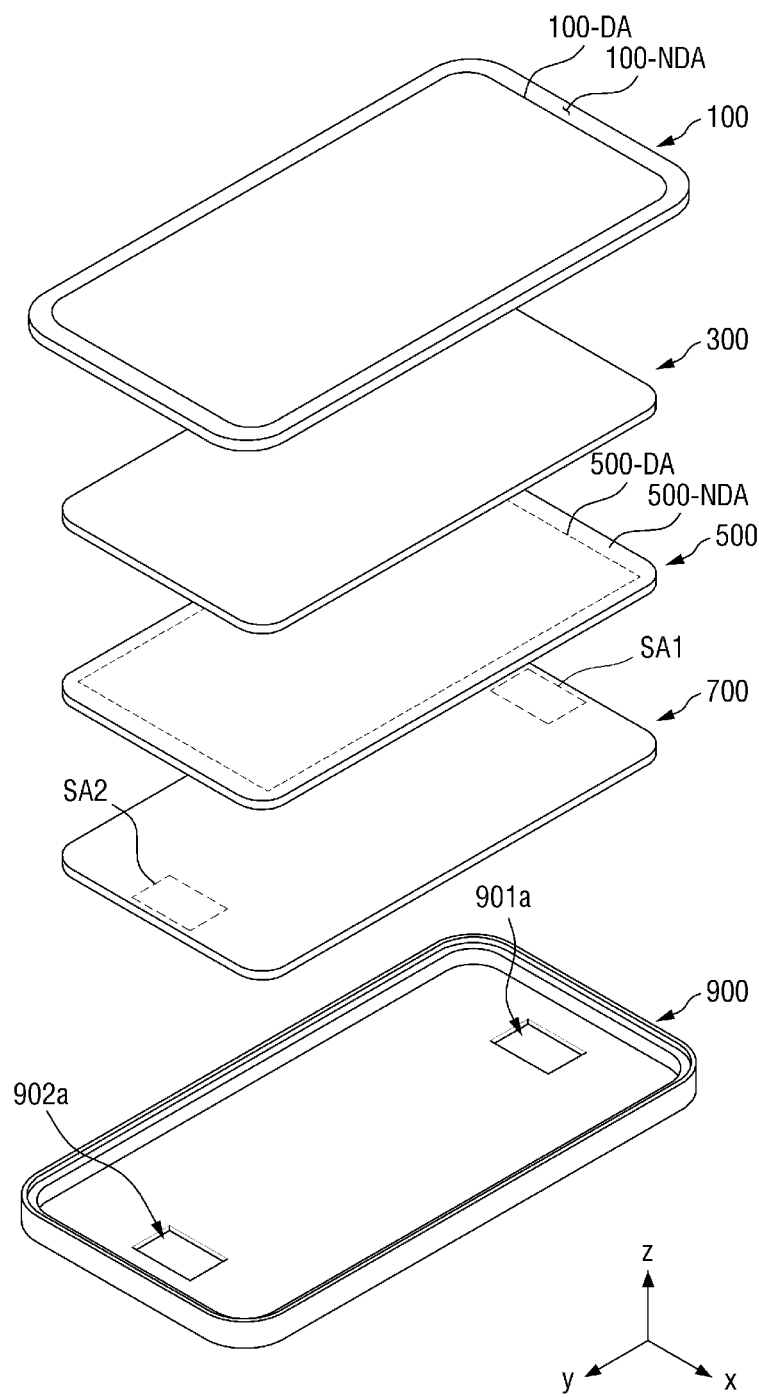
FIG. 3 is an exploded perspective view of the display device illustrated in FIG. 1.
Figure 4:
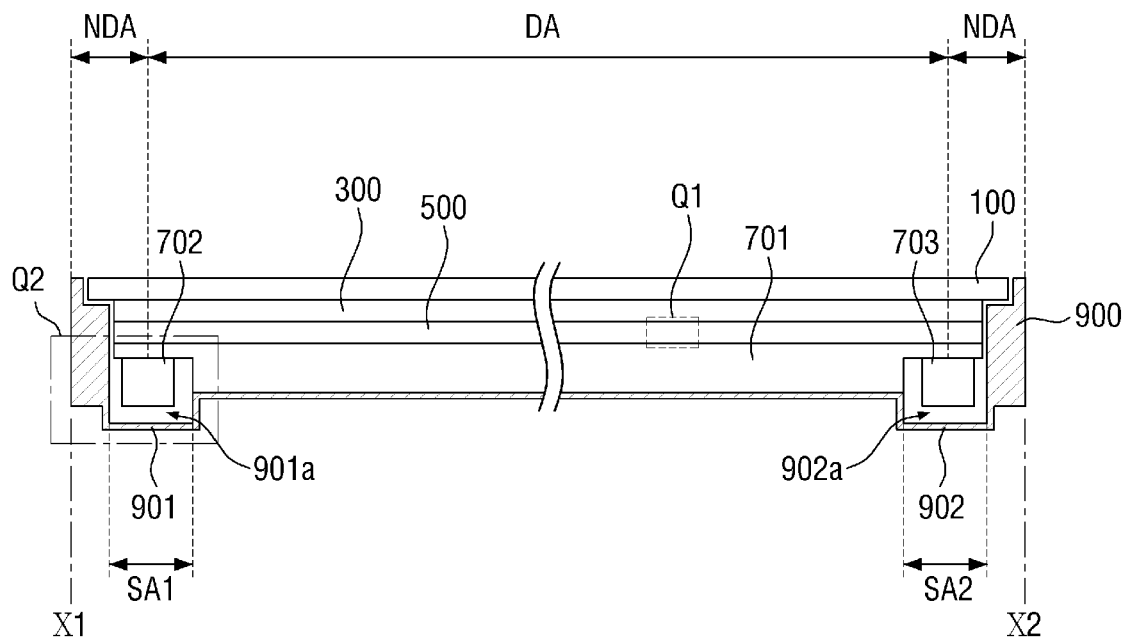
FIG. 4 is a cross-sectional view taken along line X1-X2 of FIG. 1.

FIG. 1 is a perspective view of a display device according to an exemplary embodiment of the invention, FIG. 2 is a perspective view illustrating a bracket bottom side of the display device illustrated in FIG. 1, FIG. 3 is an exploded perspective view of the display device illustrated in FIG. 1, and FIG. 4 is a cross-sectional view taken along line X1-X2 of FIG. 1.

FIG. 1 illustrates a portable terminal as an example to which a display device according to an exemplary embodiment of the invention is applied. The portable terminal may include a tablet personal computer ("PC"), a smart phone, a personal digital assistant ("PDA"), a portable multimedia player ("PMP"), a game machine, a wristwatch type electronic device, and the like. However, the invention is not limited to a specific kind of display device 1. In another exemplary embodiment of the invention, the display device 1 may be used for small-sized electronic devices such as a personal computer, a notebook computer, a car navigation apparatus, a camera and the like in addition to large-sized electronic devices such as a television or an external billboard.

Referring to FIG. 1, the display device 1 may have a planar rectangular shape. The display device 1 may include two short sides extended in one direction x and two long sides extended in the other direction y. A corner where the long side and the short side of the display device 1 meet may form a right angle, but may form a curved surface as illustrated in FIG. 1. The planar shape of the display device 1 is not limited to the described shape and may be applied as a circular shape or other shapes.

The display device 1 includes a display area DA displaying an image and a non-display area NDA adjacent to the display area DA. In some exemplary embodiments, the non-display area NDA may be arranged to surround the display area DA.

The display device 1 may include element areas SA1 and SA2 in which a vibration sound element to be described below is disposed. The vibration sound element is a concept including an element which embodies a speaker function or a microphone function using vibration. In some exemplary embodiments, the element areas SA1 and SA2 may include a first element area SA1 positioned at one side of the display area DA and a second element area SA2 facing the first element area SA1 with the display area DA interposed therebetween.

In some exemplary embodiments, a part of the element areas SA1 and SA2 may be a part of the display area DA. In an exemplary embodiment, as illustrated in FIG. 1, a part of the first element area SA1 may be a part of the display area DA, and the rest of the first element area SA1 may be a part of the non-display area NDA, for example. In an alternative exemplary embodiment, a part of the second element area SA2 may be a part of the display area DA, and the rest of the second element area SA2 may be a part of the non-display area NDA. However, the invention is not limited thereto. In another exemplary embodiment, both the first element area SA1 and the second element area SA2 may be included in the display area DA, for example. In another exemplary embodiment, a part or all of any one of the first element area SA1 and the second element area SA2 may be included in the display area DA and the other one may be included in the non-display area NDA, for example.

In some exemplary embodiments, the element areas SA1 and SA2 may be positioned on a line where the short side of the display device 1 is divided into two equal parts in a long-side direction of the display device 1.

In FIG. 1, it is illustrated that the element areas SA1 and SA2 are divided into the first element area SA1 and the second element area SA2 and positioned at opposite sides with the display area DA interposed therebetween, but it is just one example. In addition, the arrangement and the number of the element areas SA1 and SA2 may be variously changed.

Referring to FIGS. 1 to 4, the display device 1 includes a display panel 500 and a panel bottom member 700 disposed below the display panel 500. The display device 1 may further include an input sensing member 300 and a window 100 which are disposed on the display panel 500. In addition, the display device 1 may further include a bracket 900 disposed below the panel bottom member 700.

Unless otherwise defined, in the specification, the "upper", "top" and "upper surface" mean a display surface side, that is, a z direction side, based on the display panel 20, and the "lower", "bottom", and "lower surface" mean an opposite side of the display surface, that is, an opposite direction to the z-direction, based on the display panel 20.

The window 100 includes a light transmission portion 100-DA transmitting an image provided by the display panel 500 and a light shielding portion 100-NDA adjacent to the light transmission portion 100-DA. In some exemplary embodiments, the inner surface of the light shielding portion 100-NDA of the window 100 may have an opaque masking layer.

The window 100 may be disposed on the display panel 500 to protect the display panel 500. The window 100 may be disposed to overlap with the display panel 500 and cover the entire surface of the display panel 500. The window 100 may be larger than the display panel 500. In an exemplary embodiment, the window 100 may protrude outward from the display panel 500 at both short sides of the display device 1, for example. Even at both long sides of the display device 1, the window 100 may protrude from the display panel 500, but the protruding distance may be larger than that of both short sides.

In an exemplary embodiment, the window 100 may include glass, sapphire, plastic, or the like, for example. The window 100 may be rigid, but is not limited thereto and may be flexible.

In one exemplary embodiment, the input sensing member 300 may be disposed between the display panel 500 and the window 100. In an exemplary embodiment, the input sensing member 300 may be a rigid panel type, a flexible panel type, or a film type, for example. The input sensing member 300 has substantially the same size as the display panel 500 and overlaps with the display panel 500, and the side of the input sensing member 300 and the side of the display panel 500 may be aligned, but the invention is not limited thereto. The display panel 500 and the input sensing member 300, and the input sensing member 300 and the window 100 may be bonded to each other by a transparent coupling layer such as an optical transparent adhesive ("OCA") or an optical transparent resin ("OCR"), respectively, for example. In another exemplary embodiment, the input sensing member 300 may be omitted. In this case, the display panel 500 and the window 100 may be bonded to each other by the OCA or the OCR. In some exemplary embodiments, the display panel 500 may also include a touch electrode portion therein.

The display panel 500 includes a display portion 500-DA and a non-display portion 500-NDA. The display portion 500-DA is an area for displaying an image and overlaps with the light transmission portion 100-DA of the window 100. The non-display portion 500-NDA as an area where the image is not displayed is adjacent to the display portion 500-DA and overlaps with the light shielding portion 100-NDA of the window 100.

In some exemplary embodiments, the display panel 500 may be a display panel including a self-light emitting element, for example. In an exemplary embodiment, the display panel 500 may be a display panel including an organic light emitting diode ("OLED") in which a light emitting layer includes an organic light emitting layer, or a quantum dot light emitting diode in which a light emitting layer includes a quantum dot light emitting layer, for example. However, the invention is not limited thereto, and according to another exemplary embodiment of the invention, the display panel 500 may also be embodied by a liquid crystal display ("LCD") panel and the like. Hereinafter, a case where the display panel 500 is a display panel including an OLED will be described as an example.

The panel bottom member 700 is disposed below the display panel 500 and may be bonded to the display panel 500. The panel bottom member 700 has substantially the same size as that of the display panel 500 and overlaps with the display panel 500, and the side of the panel bottom member 700 and the side of the display panel 500 may be aligned, but the invention is not limited thereto. The panel bottom member 700 may perform a heat dissipation function, an electromagnetic wave shielding function, a light shielding function or light absorbing function, a buffering function, a digitizing function, and the like. The panel bottom member 700 may include a functional layer having at least one of the aforementioned functions. The functional layer may be provided in various forms such as a layer, a membrane, a film, a sheet, a plate, and a panel.

The panel bottom member 700 may include a functional layer portion 701 and vibration sound elements 702 and 703 bonded to the bottom of the functional layer portion 701.

The functional layer portion 701 is a portion including one or the plurality of functional layers described above, and when the functional layer portion 701 includes the plurality of functional layers, the plurality of functional layers may be stacked to overlap with each other. One functional layer may be stacked directly on another functional layer or bonded to another functional layer through a bonding layer.

The thickness of the portion of the functional layer portion 701 positioned in the element areas SA1 and SA2 may be smaller than the thickness of other portions.

The vibration sound elements 702 and 703 are elements that vibrate in response to a sound signal, which is an electrical signal corresponding to sound data In an exemplary embodiment, the vibration sound elements 702 and 703 may include, for example, a magnet and a coil that surrounds the magnet and flows a current corresponding to the sound signal, for example. The vibration sound elements 702 and 703 can vibrate by an electromagnetic force corresponding to the current flowing in the coil. Further, the invention is not limited thereto, and the vibration sound elements 702 and 703 may be embodied by a piezoelectric element including a vibration material layer, for example. In this case, the vibration material layer is mechanically deformed in response to the sound signal, and the vibration sound elements 702 and 703 may vibrate by the mechanical deformation. In an exemplary embodiment, the vibration material layer may include, for example, at least one of a piezoelectric material, a piezoelectric film (polyvinylidene fluoride ("PVDF")), and an electroactive polymer. Hereinafter, a case where the vibration sound elements 702 and 703 include the vibration material layer will be described as an example.

The vibration sound elements 702 and 703 may be bonded to the bottom of the functional layer portion 701 and positioned in the element areas SA1 and SA2. When the display device 1 includes the first element area SA1 and the second element area SA2 as the element areas SA1 and SA2, the vibration sound elements 702 and 703 may include a first vibration sound element 702 positioned in the first element area SA1 and a vibration sound element 703 positioned in the second element area SA2.

At least a part of the vibration sound elements 702 and 703 may be positioned in the display area DA. In an exemplary embodiment, as illustrated in FIG. 4, a part of the first vibration sound element 702 may be positioned in the display area DA and a part of the second vibration sound element 703 may be positioned in the display area DA, for example. However, the invention is not limited thereto, and in some exemplary embodiments, both the first vibration sound element 702 and the second vibration sound element 703 may be positioned in the display area DA. Further, at least a part of any one of the first vibration sound element 702 and the second vibration sound element 703 may be positioned in the display area DA, and the other one of the first vibration sound element 702 and the second vibration sound element 703 is not positioned in the display area DA, but may be positioned in the non-display area NDA.

Various exemplary embodiments of the panel bottom member 700 will be described below.

A bracket 900 may be positioned at the lower side of the panel bottom member 700. The bracket 900 accommodates the window 100, the input sensing member 300, the display panel 500, and the panel bottom member 700. The bracket 900 may include a bottom and a side wall. The bottom of the bracket 900 faces the lower surface of the panel bottom member 700, and the side wall of the bracket 900 faces the sides of the window 100, the input sensing member 300, the display panel 500, and the panel bottom member 700.

In some exemplary embodiments, the bracket 900 may include a synthetic resin material, a metal material, or a combination of different materials, for example.

In some exemplary embodiments, a part of the bracket 900 may be exposed to the side of the display device 1 to form a side appearance of the display device 1. Further, in some exemplary embodiments, an outer housing (not illustrated) may be bonded to the bottom of the bracket 900. However, this is only an example, and a separate configuration is bonded to the bottom of the bracket 900, and the bracket 900 itself may also be applied to the outer housing of the display device 1.

In order to ensure a space where the vibration sound elements 702 and 703 vibrate, the bracket 900 may not contact the vibration sound elements 702 and 703.

In some exemplary embodiments, the bracket 900 may include protrusions 901 and 902 protruding downward to form resonation spaces 901a and 902a therein. In an exemplary embodiment, when the vibration sound elements 702 and 703 include the first vibration sound element 702 and the second vibration sound element 703, the bracket 900 may include a first protrusion 901 which overlaps with the first vibration sound element 702 and defines the first resonation space 901a therein and a second protrusion 902 which overlaps with the second vibration sound element 703 and defines the second resonation space 902a therein, for example. The first resonation space 901a serves as a resonator that amplifies a vibration or a sound wave provided from the first vibration sound element 702, and the first vibration sound element 702 provides a space that may vibrate downward. Further, the second resonation space 902a serves as a resonator that amplifies a vibration or a sound wave provided from the second vibration sound element 703, and the second vibration sound element 703 provides a space that may vibrate downward.

However, the invention is not limited thereto, and the protrusions 901 and 902 may be modified to an appropriate number when necessary.

Although not illustrated, a waterproof tape may be disposed at an edge of the bottom of the bracket 900. The waterproof tape adjacent to the long side is attached to the lower surface of the panel bottom member 700 and the waterproof tape adjacent to the short side may be attached to the lower surface of the window 100.

Figure 5:
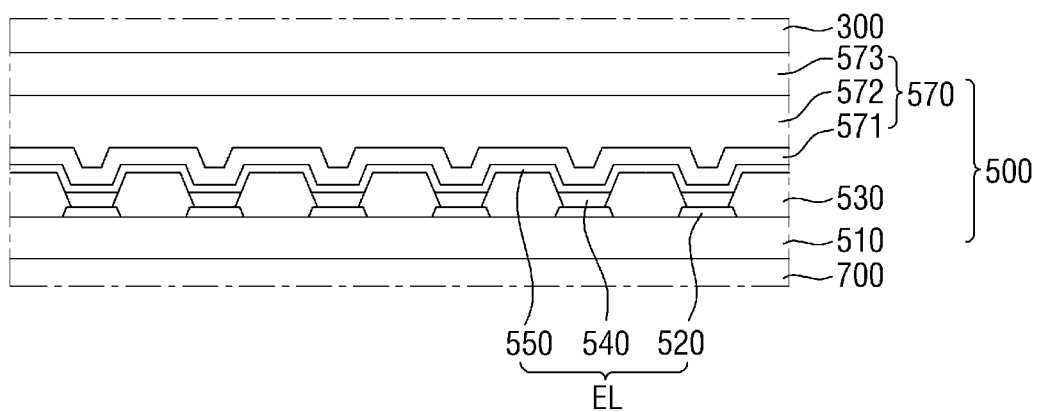
FIG. 5 is an enlarged cross-sectional view illustrating a portion Q1 of FIG. 4 and more particularly, an enlarged cross-sectional view illustrating a display panel of FIG. 4.

FIG. 5 is an enlarged cross-sectional view illustrating a portion Q1 of FIG. 4 and more particularly, an enlarged cross-sectional view illustrating the display panel of FIG. 4.

Referring to FIG. 5, the display panel 500 includes a base substrate 510, a first electrode 520, a pixel defining layer 530, a light emitting layer 540, a second electrode 550, and an encapsulation layer 570.

The base substrate 510 may be positioned on the panel bottom member 700. The base substrate 510 may be an insulating substrate. The base substrate 510, as an example, may include a polymer material having flexibility. In an exemplary embodiment, the polymer material may be polyethersulphone ("PES"), polyacrylate ("PA"), polyarylate ("PAR"), polyetherimide ("PEI"), polyethylenenaphthalate ("PEN"), polyethyleneterephthalate ("PET"), polyphenylenesulfide ("PPS"), polyallylate, polyimide ("PI"), polycarbonate ("PC"), cellulosetriacetate ("CAT"), cellulose acetate propionate ("CAP") or a combination thereof, for example.

The first electrode 520 may be positioned on the base substrate 510. In some exemplary embodiments, the first electrode 520 may be an anode electrode, for example.

Although not illustrated, a plurality of configurations may be further disposed between the base substrate 510 and the first electrode 520. The plurality of configurations as one example may include a buffer layer, a plurality of conductive wirings, an insulating layer, a plurality of thin film transistors, and the like.

The pixel defining layer 530 may be positioned on the first electrode 520. Openings that expose at least a part of the first electrode 520 are defined in the pixel defining layer 530.

The light emitting layer 540 may be positioned on the first electrode 520.

In some exemplary embodiments, the light emitting layer 540 may emit one of red light, green light, and blue light, for example. In an exemplary embodiment, the wavelength of the red light may be about 620 nanometers (nm) to about 750 nm, and the wavelength of the green light may be about 495 nm to about 570 nm, for example. In an exemplary embodiment, the wavelength of the blue light may be about 450 nm to about 495 nm, for example.

In an alternative exemplary embodiment, the light emitting layer 540 may emit white light, for example. When the light emitting layer 540 emits the white light, the light emitting layer 540 may have a form in which a red light emitting layer, a green light emitting layer, and a blue light emitting layer are stacked. Further, a separate color filter for display red, green, and blue may be further included.

In some exemplary embodiments, the light emitting layer 540 may be an organic light emitting layer. In an alternative exemplary embodiment, the light emitting layer 540 may also be a quantum dot light emitting layer, for example.

The second electrode 550 may be disposed on the light emitting layer 540 and the pixel defining layer 530. The second electrode 550 may be entirely disposed on the light emitting layer 540 and the pixel defining layer 530 as an example. In some exemplary embodiments, the second electrode 550 may be a cathode electrode, for example.

The first electrode 520, the second electrode 550, and the light emitting layer 540 may form a self-light emitting element EL.

The encapsulation layer 570 may be positioned on the self-light emitting element EL. The encapsulation layer 570 may encapsulate the self-light emitting element EL and prevent moisture and the like from flowing into the self-light emitting element EL from the outside.

In some exemplary embodiments, the encapsulation layer 570 may include a thin film encapsulation and include one or more organic films and one or more inorganic films. In an exemplary embodiment, the encapsulation layer 570 may include a first inorganic film 571 positioned on the second electrode 550, an organic film 572 positioned on the first inorganic film 571, and a second inorganic film 573 positioned on the organic film 572, for example.

The first inorganic film 571 may prevent moisture, oxygen, and the like from penetrating to the self-light emitting element EL. In an exemplary embodiment, the first inorganic film 571 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and the like, for example.

The organic film 572 may be positioned on the first inorganic film 571. The organic film 572 may improve the flatness. In an exemplary embodiment, the organic film 572 may include a liquid organic material and may include, for example, an acrylic resin, a methacrylic resin, polyisoprene, a vinyl resin, an epoxy resin, a urethane resin, a cellulose resin, and a perylene resin. Such an organic material may be provided on the base substrate 510 through deposition, printing, and coating and may be subjected to a curing process, for example.

The second inorganic film 573 may be positioned on the organic film 572. The second inorganic film 573 may have substantially the same or similar role as or to the first inorganic film 571 and may include a material substantially the same as or similar to that of the first inorganic film 571. The second inorganic film 573 may completely cover the organic film 572. In some exemplary embodiments, the second inorganic film 573 and the first inorganic film 571 may be in contact with each other in the non-display area NDA to form an inorganic-inorganic bonding.

However, the structure of the encapsulation layer 570 is not limited thereto and the stacked structure of the encapsulation layer 570 may be variously changed. In an alternative exemplary embodiment, the encapsulation layer 570 may include a glass substrate and the like, for example.

In some exemplary embodiments, the input sensing member 300 may be disposed on the encapsulation layer 570.

Figure 6:
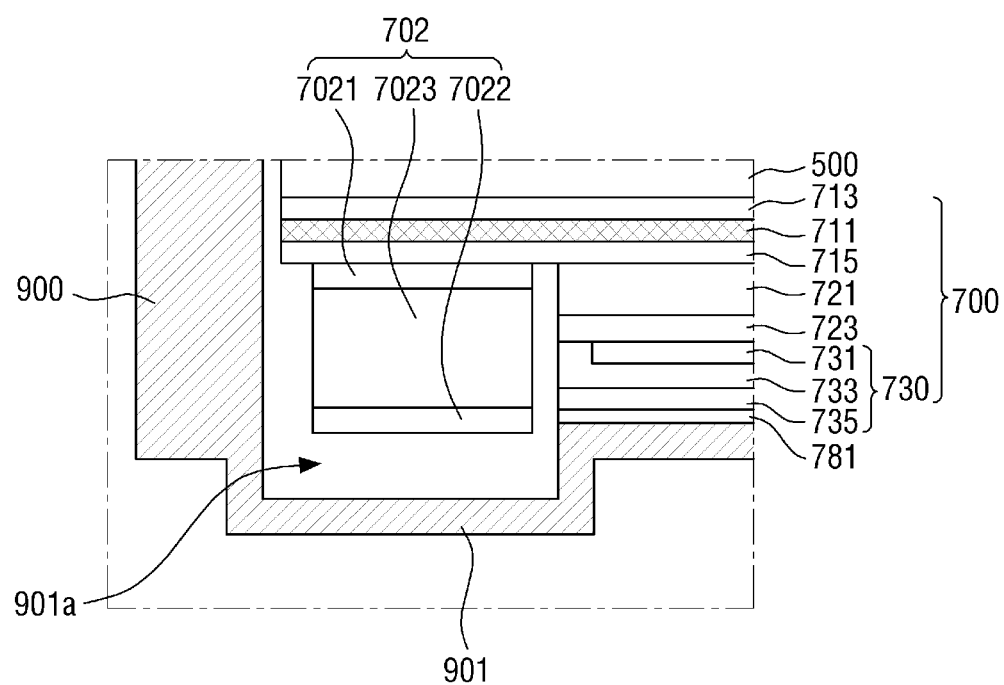
FIG. 6 is an enlarged cross-sectional view illustrating a portion Q2 of FIG. 4 and more particularly, an enlarged cross-sectional view illustrating a panel bottom member of FIG. 4.
Figure 7:
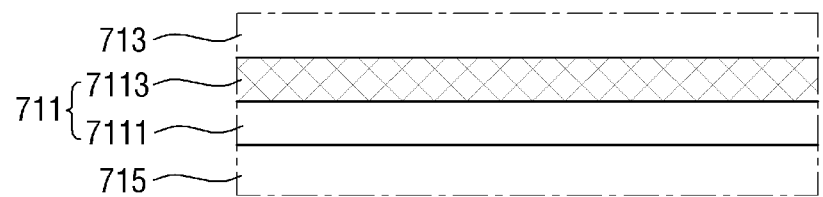
FIG. 7 is a cross-sectional view illustrating a structure of a light absorbing member of FIG. 6.
Figure 8:
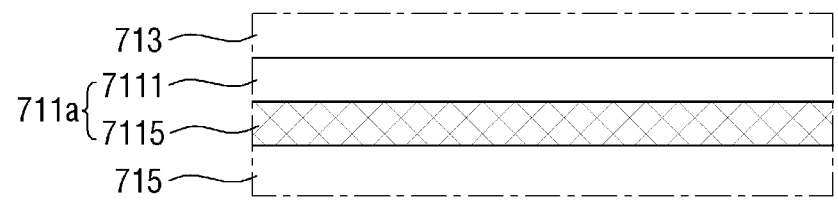
FIGS. 8 and 9 are diagrams illustrating modifications of FIG. 7.
Figure 9:
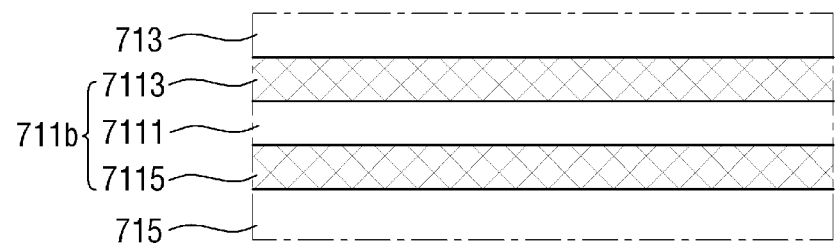

FIG. 6 is an enlarged cross-sectional view illustrating a portion Q2 of FIG. 4 and more particularly, an enlarged cross-sectional view illustrating a panel bottom member of FIG. 4, FIG. 7 is a cross-sectional view illustrating a structure of a light absorbing member of FIG. 6, and FIGS. 8 and 9 are diagrams illustrating modifications of FIG. 7.

Referring to FIGS. 4 and 6 to 9, the functional layer portion 701 of the panel bottom member 700 includes a light absorbing member 711 disposed below the display panel 500, a top bonding layer 713 positioned between the light absorbing member 711 and the display panel 500, a first interlayer bonding layer 715 positioned below the light absorbing member 711, and a buffer member 721 disposed below the first interlayer bonding layer 715. The functional layer portion 701 of the panel bottom member 700 may further include a second interlayer bonding layer 723 disposed below the buffer member 721 and a heat dissipation member 730 disposed below the second interlayer bonding layer 723. Further, the functional layer portion 701 of the panel bottom member 700 may further include a bottom bonding member 781 positioned at the lower side of the heat dissipation member 730.

The light absorbing member 711 is disposed below the display panel 500 and blocks transmission of light to prevent the configurations disposed at the lower side of the light absorbing member 711 from being viewed from the top.

The light absorbing member 711 may have various structures.

In an exemplary embodiment, the light absorbing member 711 may include a substrate 7111 and a first light absorbing layer 7113 disposed on the upper surface of the substrate 7111 as illustrated in FIG. 7, for example. In addition, the top bonding layer 713 may be disposed on the upper surface of the first light absorbing layer 7113 and the first interlayer bonding layer 715 may be disposed on the lower surface of the substrate 7111.

In an exemplary embodiment, the substrate 7111 may include PET, PI, PC, polyethylene ("PE"), polypropylene ("PP"), polysulfone ("PSF"), polymethylmethacrylate ("PMMA"), triacetylcellulose ("TAC"), cycloolefin polymer ("COP"), and the like, for example.

The first light absorbing layer 7113 is disposed on the upper surface of the substrate 7111. The first light absorbing layer 7113 may be disposed directly on the upper surface of the substrate 7111. The first light absorbing layer 7113 may be disposed to completely cover the first vibration sound element 702 and the second vibration sound element 703 which are disposed therebelow. In other words, the first vibration sound element 702 and the second vibration sound element 703 may completely overlap with the first light absorbing layer 7113. Further, in some exemplary embodiments, the first light absorbing layer 7113 may be disposed to completely cover the functional layers which are disposed therebelow. The first light absorbing layer 7113 may be disposed on the entire upper surface of the substrate 7111.

The first light absorbing layer 7113 blocks the transmission of light to prevent the first vibration sound element 702 and the second vibration sound element 703 therebelow from being viewed from the top. The first light absorbing layer 7113 may include a light absorbing material such as a black pigment or dye. The first light absorbing layer 7113 may include a black ink, for example. The first light absorbing layer 7113 may be disposed on the upper surface of the substrate 7111 by a coating or printing method, for example.

In the exemplary embodiment, the case where the first light absorbing layer 7113 is disposed on the upper surface of the substrate 7111 is exemplified, but the invention is not limited thereto.

In an exemplary embodiment, as illustrated in FIG. 8, a light absorbing member 711*a* may include a substrate 7111 and a second light absorbing layer 7115 disposed on the lower surface of the substrate 7111, for example. In addition, the top bonding layer 713 may be disposed on the upper surface of the substrate 7111 and the first interlayer bonding layer 715 may be disposed on the lower surface of the second light absorbing layer 7115. The second light absorbing layer 7115 may be disposed to completely cover the first vibration sound element 702 and the second vibration sound element 703 therebelow. In addition, the description of the second light absorbing layer 7115 is substantially the same as or similar to that of the first light absorbing layer 7113 and will be omitted.

In an alternative exemplary embodiment, as illustrated in FIG. 9, a light absorbing member 711*b* may include a substrate 7111, a first light absorbing layer 7113 disposed on the upper surface of the substrate 7111, and a second light absorbing layer 7115 disposed on the lower surface of the substrate 7111. In addition, the top bonding layer 713 may be disposed on the upper surface of the first light absorbing layer 7113 and the first interlayer bonding layer 715 may be disposed on the lower surface of the second light absorbing layer 7115.

The top bonding layer 713 is disposed on the upper surface of the light absorbing member 711. The top bonding layer 713 serves to attach the panel bottom member 700 to the lower surface of the display panel 500. The top bonding layer 713 may include a bonding layer, an adhesive layer, or a resin layer. In an exemplary embodiment, the top bonding layer 713 may include polymer materials classified into a silicone polymer, a urethane polymer, an SU polymer having a silicone-urethane hybrid structure, an acrylic polymer, an isocyanate polymer, a polyvinyl alcohol polymer, a gelatin polymer, a vinyl polymer, a latex polymer, a polyester polymer, a water-based polyester polymer, and the like, for example.

The first interlayer bonding layer 715 is disposed on the lower surface of the light absorbing member 711. The first interlayer bonding layer 715 bonds the light absorbing member 711 and the buffer member 721 to each other. Further, the first interlayer coupling layer 715 is disposed to overlap with the first vibration sound element 702 and the second vibration sound element 703 and bond the light absorbing member 711 and the first vibration sound element 702 and the light absorbing member 711 and the second vibration sound element 703.

The material of the first interlayer bonding layer 715 may include exemplary materials of the top bonding layer 713 described above.

The buffer member 721 absorbs an external shock to prevent the display panel 500, the window 100, and the like from being damaged. The buffer member 721 may be composed of a single layer or a plurality of laminated films. In an exemplary embodiment, the buffer member 721 may include a polymer resin such as polyurethane, polycarbonate, polypropylene, and polyethylene, or may include a material having elasticity such as a rubber and a foamed sponge foaming and molding a urethane-based material or an acrylic material, for example. The buffer member 721 may be a cushion layer.

The buffer member 721 may not overlap with the vibration sound elements 702 and 703. As described above, the buffer member 721 may include a material having elasticity. The vibration sound elements 702 and 703 generate vibration in response to a sound signal or the like, and the generated vibration is transmitted to the display panel 500 to generate a sound. That is, the display panel 500 serves as a diaphragm of the speaker. Accordingly, the buffer member 721 may not overlap with the vibration sound elements 702 and 703 so that the vibration generated in the vibration sound elements 702 and 703 is not absorbed in the buffer member 721, but is transmitted to the display panel 500.

The second interlayer bonding layer 723 serves to bond another member to the buffer member 721 and may include materials exemplified as the material of the top bonding layer 713 described above. In the exemplary embodiment, the second interlayer bonding layer 723 may bond the heat dissipation member 730 to the buffer member 721. In some exemplary embodiments, the second interlayer bonding layer 723 may not overlap with the vibration sound elements 702 and 703.

The heat dissipation member 730 may be positioned below the second interlayer bonding layer 723. The heat dissipation member 730 may include at least one heat dissipation layer. In the drawing, a case where the heat dissipation member 730 includes two heat dissipation layers 731 and 735 and a bonding layer 733 is illustrated.

The first heat dissipation layer 731 and the second heat dissipation layer 735 may include the same material, but may also include materials having different heat dissipation characteristics. In an exemplary embodiment, the first heat dissipation layer 731 may include graphite, carbon nanotube, or the like, for example. The second heat dissipation layer 735 may include various materials capable of shielding electromagnetic waves and having excellent thermal conductivity. In an exemplary embodiment, the second heat dissipation layer 735 may include a metal thin film such as copper, nickel, ferrite, and silver, for example.

The second heat dissipation layer 735 may be disposed below the first heat dissipation layer 731. In some exemplary embodiments, the first heat dissipation layer 731 and the second heat dissipation layer 735 are disposed to overlap with each other, and the first heat dissipation layer 731 is smaller than the second heat dissipation layer 735 and the side of the first heat dissipation layer 731 may be positioned inside the side of the second heat dissipation layer 735.

A bonding layer 733 is positioned between the first heat dissipation layer 731 and the second heat dissipation layer 735. The bonding layer 733 may bond the first heat dissipation layer 731 and the second heat dissipation layer 735 and completely cover the first heat dissipation layer 731. The material of the bonding layer 733 may include exemplary materials of the top bonding layer 713 described above.

In some exemplary embodiments, the heat dissipation member 730 may not overlap with the vibration sound elements 702 and 703. The heat dissipation member 730 is to secure a space capable of vibrating the vibration sound elements 702 and 703.

A bottom bonding member 781 may be positioned below the heat dissipation member 730. The bottom bonding member 781 serves to bond the panel bottom member 700 to the bracket 900. In some exemplary embodiments, the bottom bonding member 781 may not contact the vibration sound elements 702 and 703 to prevent interference from being generated when the vibration sound elements 702 and 703 vibrate.

In some exemplary embodiments, the bottom bonding member 781 may include a tape having a bonding layer on both surfaces, for example, a double-sided bonding tape.

The vibration sound elements 702 and 703 are disposed below the first interlayer bonding layer 715 and positioned in the element areas SA1 and SA2. The vibration sound elements 702 and 703 may not overlap with the buffer member 721.

In some exemplary embodiments, the vibration sound elements 702 and 703 may include two electrodes and a vibration material layer positioned therebetween.

When the first vibration sound element 702 is described as an example, the first vibration sound element 702 may include a first electrode 7021 positioned below the first interlayer bonding layer 715, a vibration material layer 7023 positioned below the first electrode 7021, and a second electrode 7022 positioned below the vibration material layer 7023. The first electrode 7021 may contact the first interlayer bonding layer 715.

The first electrode 7021 and the second electrode 7022 provide an electric field to the vibration material layer 7023. The first electrode 7021 and the second electrode 7022 include a conductive material. In an exemplary embodiment, the conductive material may be a transparent conductor such as indium tin oxide ("ITO"), indium zinc oxide ("IZO"), an opaque metal, a conducting polymer, and a carbon nanotube ("CNT"), for example.

The vibration material layer 7023 includes a piezo material that vibrates by an electric field provided by the first electrode 7021 and the second electrode 7022, and the examples of the piezo material may be at least one of a piezoelectric material such as a PVDF film or lead zirconate titanate ceramics ("PZT") and an electroactive polymer.

Hereinafter, the characteristics of the vibration sound elements and a process of generating the sound therefrom will be described with reference to FIGS. 21 and 22, and the first vibration sound element will be described as an example.

Figure 21:
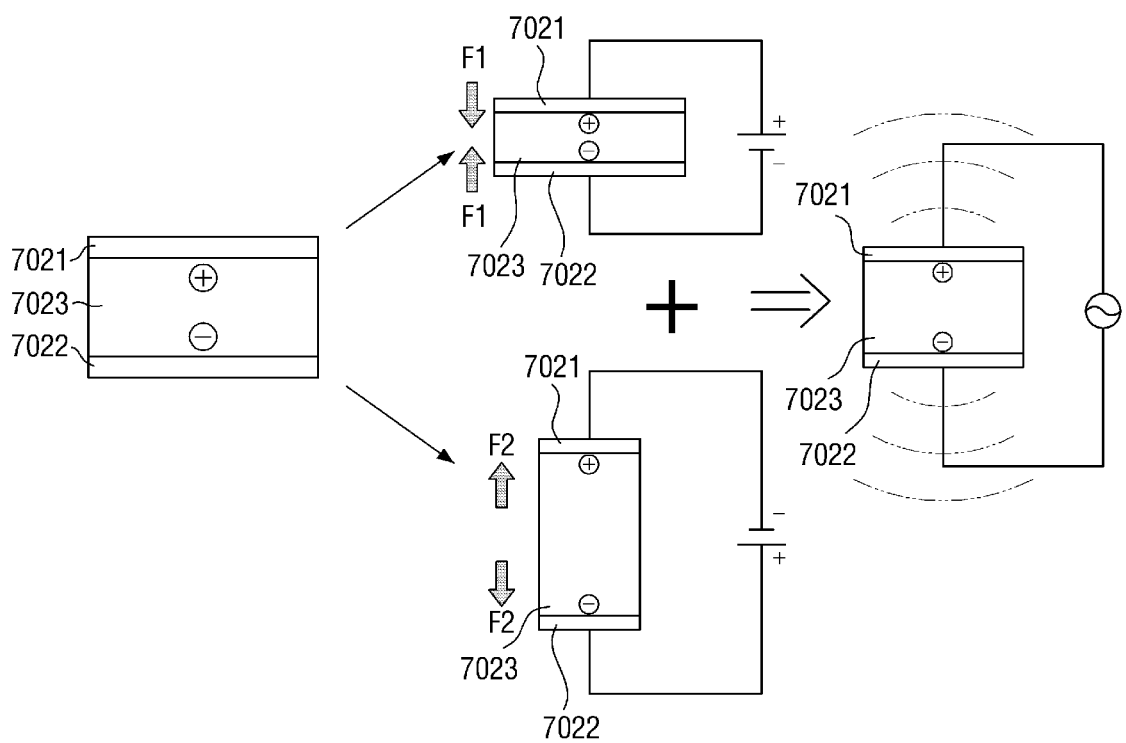
FIG. 21 is a schematic diagram for describing a characteristic of a vibration sound element.
Figure 22:
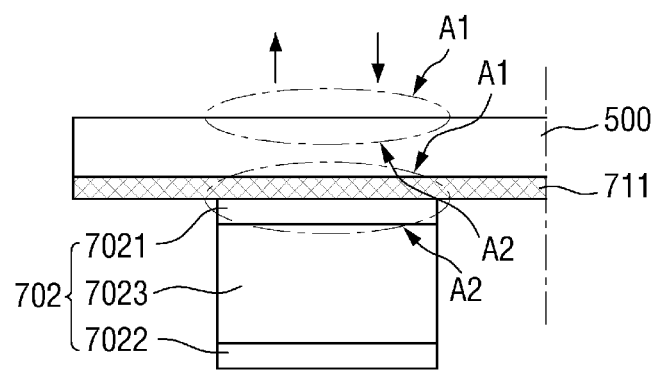
FIG. 22 is a schematic diagram for describing a process of generating a sound by the vibration sound element.

FIG. 21 is a schematic diagram for describing a characteristic of a vibration sound element and FIG. 22 is a schematic diagram for describing a process of generating a sound by the vibration sound element. In FIG. 22, for convenience of description, only the first vibration sound element 702, the light absorbing member 711, and the display panel 500 are illustrated.

Referring to FIGS. 21 and 22, the vibration material layer 7023 is contracted by receiving a first force F1 in a polarity direction of the applied voltage, or relaxed or expanded by receiving a second force F2. Accordingly, when AC voltages are applied to the first electrode 7021 and the second electrode 7022, respectively, the vibration material layer 7023 repeats contraction and relaxation due to an inverse piezoelectric effect. The first vibration sound element 702 vibrates by repeating the contraction and relaxation.

When the first vibration sound element 702 is relaxed, the display panel 500 may be temporarily deformed upward as illustrated in a dotted line A1. Further, when the first vibration sound element 702 is contracted, the display panel 500 may be temporarily deformed downward as illustrated in a dotted line A2. The display panel 500 vibrates up and down by repeating the contraction and relaxation of the first vibration sound element 702 to output the sound.

That is, the display panel 500 itself functions as a diaphragm of the speaker.

Generally, as the size of the diaphragm of the speaker is increased, the intensity of a sound pressure of the sound outputted from the diaphragm is increased and an output characteristic in a low range is excellent. Accordingly, the intensity of the sound output through the display panel 500 and the output characteristic of the low range may be adjusted in response to the area of the display panel 500. Particularly, since the size of a diaphragm of a typical speaker applied to a general display device is too small as compared with the area of the display panel, the intensity of the sound pressure or the output characteristic of the low range of the sound output from the display device 500 according to the exemplary embodiment of the invention using the display device 500 itself as the diaphragm is excellent as compared with the intensity of the sound pressure or the output characteristic of the low range of the sound output from a general speaker.

Further, the display device 1 uses a part of the display panel 500 as a diaphragm without a separate speaker and has advantages of reducing the size of the display device 1 and simplifying the structure. In addition, a part or all of the vibration sound elements 702 and 703 may be disposed in the display area DA, and there is an advantage that the size of the display area DA may be increased.

In addition, since the panel bottom member 700 includes the vibration sound elements 702 and 703, the display device 1 has advantages of bonding the vibration sound elements 702 and 703 and the display panel 500 by attaching the panel bottom member 700 to the display panel 500, 702, 703 and thus simplifying the manufacturing process of the display device 1.

Figure 10:
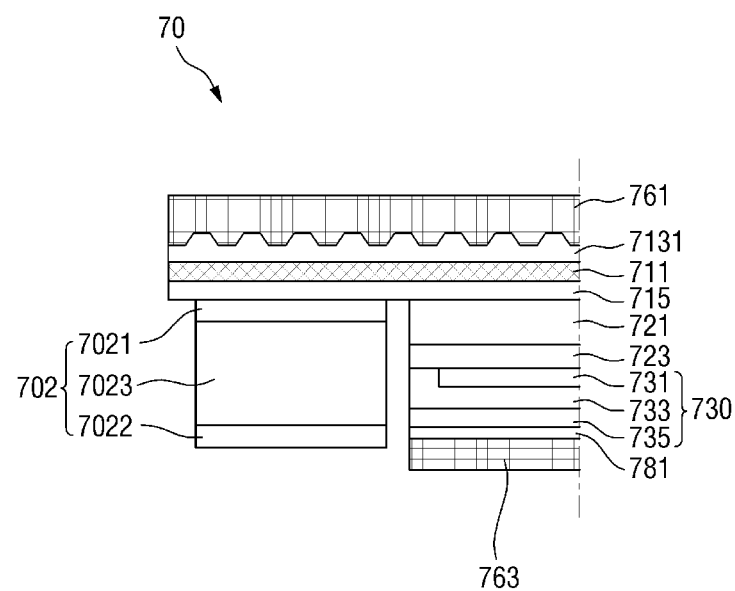
FIG. 10 is a cross-sectional view of an exemplary embodiment of a panel bottom member according to the invention.

FIG. 10 is a cross-sectional view of a panel bottom member according to an exemplary embodiment of the invention, and more particularly, a cross-sectional view illustrating a structure before the panel bottom member illustrated in FIG. 6 is attached to the display panel.

Referring to FIG. 10, the panel bottom member 70 includes a first release film 761 disposed on the upper surface of the top bonding layer 7131. The first release film 761 covers and protects the upper surface of the top bonding layer 7131 before the panel bottom member 70 is attached to the display panel 500 and is released when the panel bottom member 70 is attached to the display panel 500 to expose the upper surface of the top bonding layer 7131, which becomes a bonding surface.

The first release film 761 is in contact with the top bonding layer 7131, but is not completely attached and may be contacted enough to be released in a subsequent process. In an exemplary embodiment, the first release film 761 may include PET, PC, PI, paper, or the like, for example. In order to increase the releasing force of the first release film 761, a silicone solution is treated on the upper surface of the film, or a release coating layer including a silicone resin may be provided, but the invention is not limited thereto.

In some exemplary embodiments, the lower surface of the first release film 761 may have an embossed shape. The embossed shape of the lower surface of the first release film 761 is transferred to the upper surface of the top bonding layer 7131 adjacent thereto, and as a result, the upper surface of the top bonding layer 7131 may have an embossed shape which is complementary to the lower surface shape of the first release film 761. When the top bonding layer 7131 has an embossed shape on the upper surface, the surface embossed shape serves as an air passage when the panel bottom member 70 is attached to the lower surface of the display panel 500, thereby reducing bubbles. When the top bonding layer 7131 is completely attached to the bottom of the display panel 500, the embossed shape of the top bonding layer 7131 may be collapsed and flattened, as illustrated in FIG. 6.

The panel bottom member 70 may further include a second release film 763 disposed on the lower surface of the bottom bonding member 781. The second release film 763 may protect the lower surface of the bottom bonding member 781. The second release film 763 may be substantially the same as the first release film 761 described above. Although the upper surface of the second release film 763 has no embossed shape in the drawing, the second release film 763 may have an embossed shape like the lower surface of the first release film 761.

In addition, the configuration of a panel bottom member 700-1 is substantially the same as the description of each configuration of the panel bottom member 700 described in the description of FIG. 6 and thus, the description thereof will be omitted.

Figure 11:
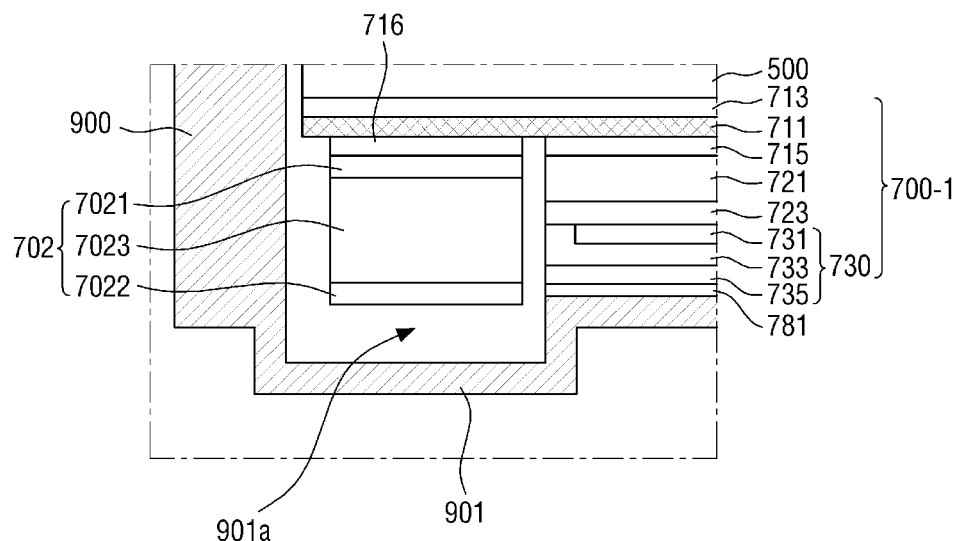
FIG. 11 is a cross-sectional view illustrating a modification of FIG. 6.
Figure 12:
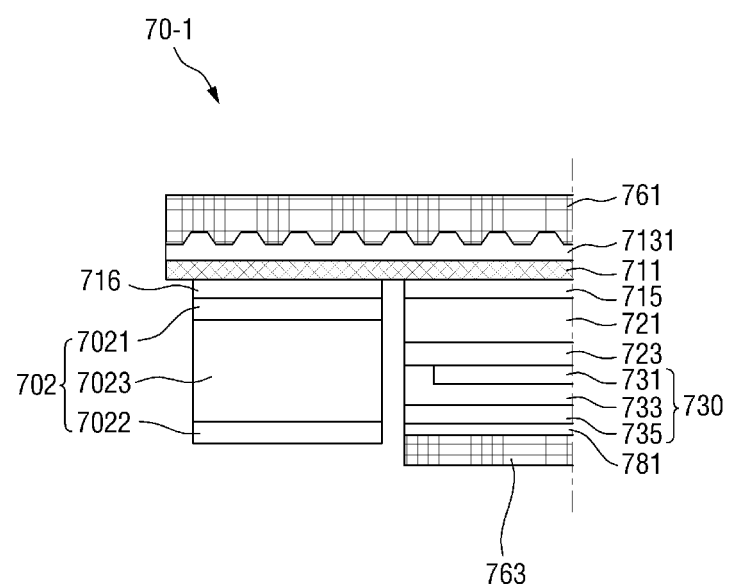
FIG. 12 is a cross-sectional view illustrating a modification of FIG. 10.

FIG. 11 is a cross-sectional view illustrating a modification of FIG. 6 and FIG. 12 is a cross-sectional view illustrating a modification of FIG. 10. The panel bottom member 700-1 illustrated in FIG. 11 has a difference from the exemplary embodiment of FIG. 6 in that the first vibration sound element 702 is bonded to the light absorbing member 711 by the medium of a separate bonding member 716. Similarly, the panel bottom member 70-1 illustrated in FIG. 12 has a difference from the exemplary embodiment of FIG. 6 in that the first vibration sound element 702 is bonded to the light absorbing member 711 by the medium of a separate bonding member 716.

Particularly, the first interlayer bonding layer 715 and the first vibration sound element 702 may not overlap with each other and may not contact each other. In other words, the first vibration sound element 702 is not bonded to the light absorbing member 711 by the medium of the first interlayer bonding layer 715.

A bonding member 716 may be disposed between the first vibration sound element 702 and the light absorbing member 711 and the first vibration sound element 702 may be bonded to the light absorbing member 711 by the medium of the bonding member 716.

The bonding member 716 may be spaced apart from the first interlayer bonding layer 715.

In some exemplary embodiments, the bonding member 716 may include a tape having a bonding property of both sides. In an alternative exemplary embodiment, the bonding member 716 may also include a different material from that of the first interlayer bonding layer 715.

Figure 13:
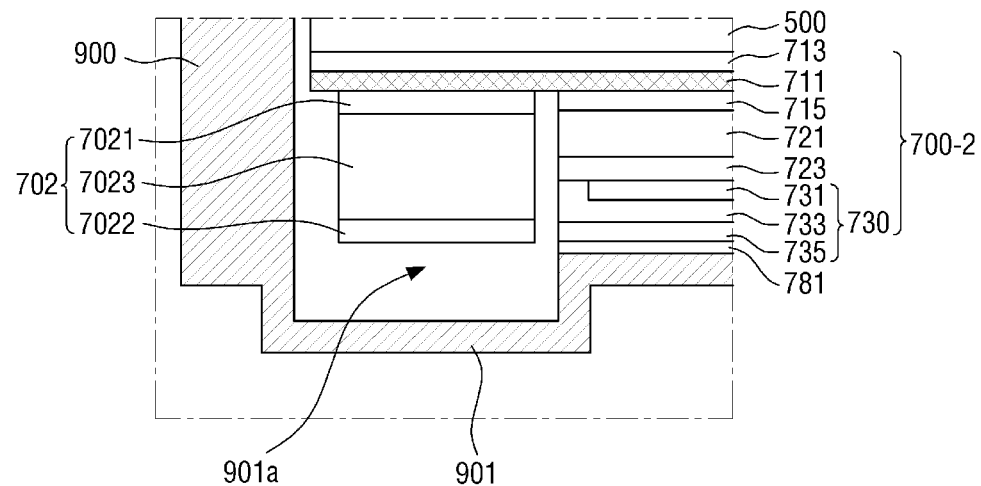
FIG. 13 is a cross-sectional view illustrating another modification of FIG. 6.
Figure 14:
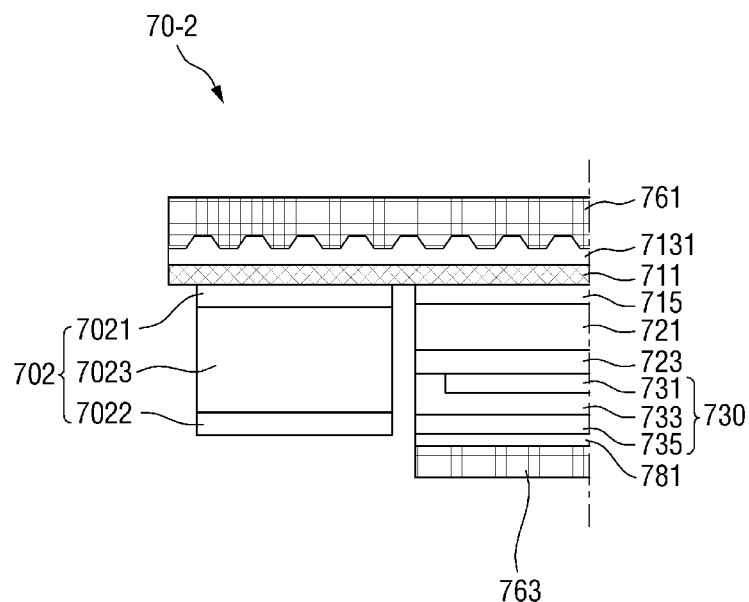
FIG. 14 is a cross-sectional view illustrating another modification of FIG. 10.

FIG. 13 is a cross-sectional view illustrating another modification of FIG. 6 and FIG. 14 is a cross-sectional view illustrating another modification of FIG. 10. There is a difference from the exemplary embodiments of FIGS. 6 and 10 in that the panel bottom member 700-2 illustrated in FIG. 13 and the panel bottom member 70-2 illustrated in FIG. 14 are arranged to directly contact the lower surface of the light absorbing member 711 without a separate medium.

Particularly, the first interlayer bonding layer 715 and the first vibration sound element 702 may not overlap with each other and may not contact each other.

The first electrode 7021 of the first vibration sound element 702 may directly contact the lower surface of the light absorbing member 711, and the vibration material layer 7023 is positioned below the first electrode 7021 and the second electrode 7022 may be disposed below the vibration material layer 7023. In an exemplary embodiment, the structure may be embodied by processes of forming a first electrode 7021 by depositing a conductive layer on the lower surface of the light absorbing member 711 and patterning the conductive layer, forming a vibration material layer 7023 by depositing a vibration material on the first electrode 7021 and the lower surface of the light absorbing member 711 and patterning the vibration material, and forming a second electrode 7022 by depositing a conductive layer on the vibration material layer 7023 and the lower surface of the light absorbing member 711 and patterning the conductive layer, for example. However, the invention is not limited thereto, and the structure may be embodied by various methods.

Figure 15:
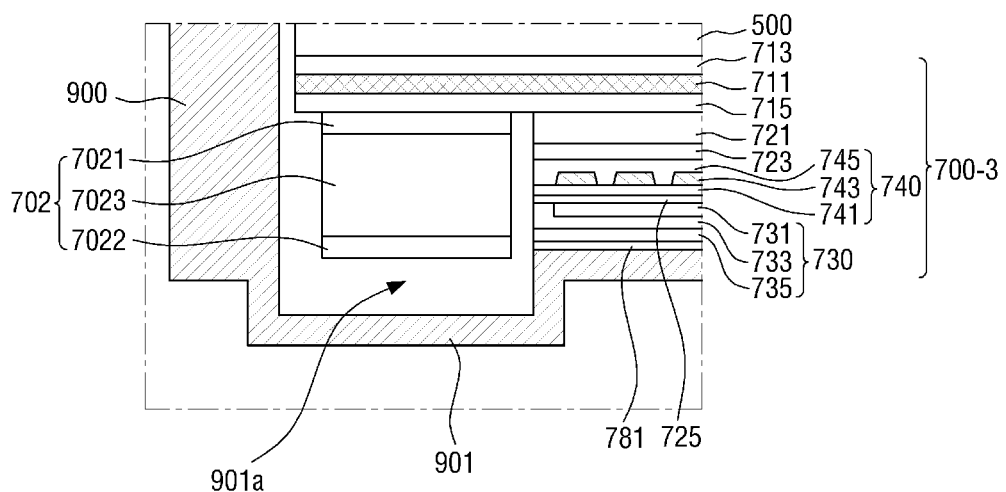
FIG. 15 is a cross-sectional view illustrating yet another modification of FIG. 6.
Figure 16:
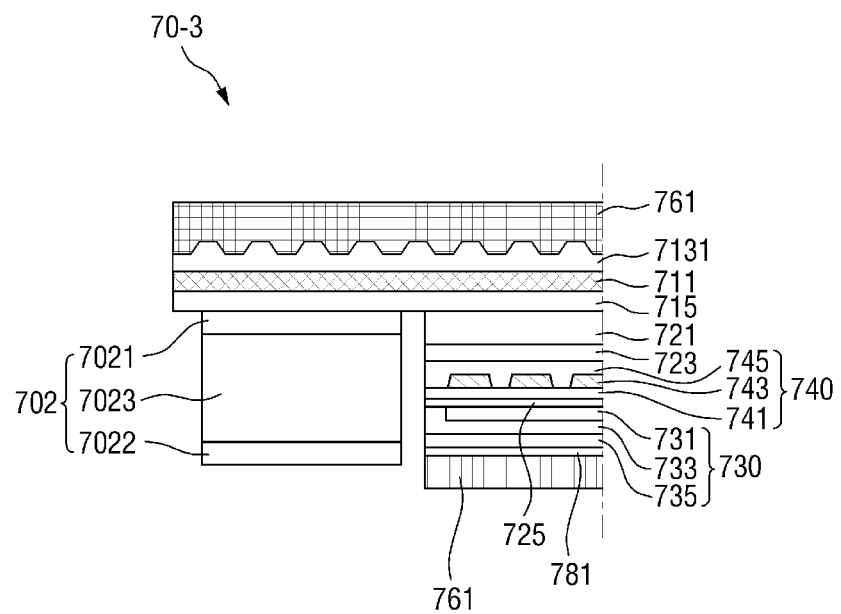
FIG. 16 is a cross-sectional view illustrating yet another modification of FIG. 10.

FIG. 15 is a cross-sectional view illustrating yet another modification of FIG. 6 and FIG. 16 is a cross-sectional view illustrating yet another modification of FIG. 10. There is the largest difference from the exemplary embodiments of FIGS. 6 and 10 in that the panel bottom member 700-3 illustrated in FIG. 15 and the panel bottom member 70-3 illustrated in FIG. 16 further include a digitizer 740 and a third interlayer bonding layer 725, and other configurations are substantially the same as or similar to each other.

Particularly, the digitizer 740 may be disposed below the buffer member 721 and the digitizer 740 may be positioned between the buffer member 721 and the heat dissipation member 730.

The digitizer 740 may be positioned below the second interlayer bonding layer 723 to be bonded to the buffer member 721 through the second interlayer bonding layer 723.

The third interlayer bonding layer 725 may be positioned between the digitizer 740 and the heat dissipation member 730 and the heat dissipation member 730 may be bonded to the digitizer 740 by the medium of the third interlayer bonding layer 725. The material of the third interlayer bonding layer 725 may include exemplary materials of the top bonding layer 713 described above.

The digitizer 740, which is one of input devices, receives position information designated by a user on the screen, unlike an input device such as a keyboard or a mouse. The digitizer recognizes the motion of, for example, a stylus pen and converts the motion into a digital signal. In an exemplary embodiment, the digitizer may be provided in a form of a film or panel, for example.

The digitizer 740 may include a wiring pattern 743 and insulating layers 741 and 745 surrounding the wiring pattern 743 at the top and bottom. Particularly, the digitizer 740 may include a first insulating layer 741, a wiring pattern 743 disposed on the upper surface of the first insulating layer 741, and a second insulating layer 745 covering the upper surface of the wiring pattern 743. The wiring pattern 743 covers a part of the upper surface of the first insulating layer 741 and exposes another part of the upper surface of the first insulating layer 741. The second insulating layer 745 may be disposed on the upper surface of the exposed first insulating layer 741 as well as the upper surface and the side of each wiring pattern 743.

In an exemplary embodiment, the wiring pattern 743 may include a metallic material such as copper, silver, nickel, and tungsten. The wiring pattern 743 may include a single layer or a plurality of laminated layers. In an exemplary embodiment, the wiring pattern 743 may be a double film including a lower copper film and an upper copper film. The wiring pattern 743 may include a floating wiring, a floating electrode, and the like as well as wirings or electrodes transferring the signal.

The first and second insulating layers 741 and 745 may include an organic insulating material, an inorganic insulating material, an organic/inorganic insulating material, or a bonding material such as a bonding material, an adhesive material, or the like.

When the wiring pattern 743 includes a material such as a metal, the wiring pattern 743 reflects light incident to the top well due to high reflectivity. When the reflected light is emitted to the display area DA side, the user may recognize the shape of the wiring pattern 743, and as a result, the image quality of the display device 1 may be adversely affected.

In addition, since the wiring pattern 743 is disposed only in a partial area of the upper surface of the first insulating layer 741, a step may be provided between a portion where the wiring pattern 743 is positioned and a portion where the wiring pattern 743 is not positioned. Such a step shape may be partially reflected even to the upper layer. That is, in the drawing, for clear description, although the upper surface of the second insulating layer 745 is flatly illustrated, but according to another exemplary embodiment, the upper surface of the second insulating layer 745 may have an uneven shape which is not flatted by conformingly reflecting the step shape according to the wiring pattern 743. Such a surface unevenness may also affect other layers disposed on the top, so that surface unevenness may be partially provided. The surface unevenness of the respective layers may have an effect on recognizing a specific pattern from the display screen side by varying the reflectance or the reflection angle (an emitting direction of the reflected light) of the incident light.

The light absorbing member 711 prevents such reflected light from being emitted to the display area DA. That is, the light absorbing member 711 overlaps with the digitizer 740 to completely cover the digitizer 740.

In the drawing, it is illustrated that the second insulating layer 745 of the digitizer 740 is in contact with the second interlayer bonding layer 723 and the first insulating layer 741 is in contact with the third interlayer bonding layer 725, but this is only one example. In some exemplary embodiments, the first insulating layer 741 may contact the second interlayer bonding layer 723 and the second insulating layer 745 may also contact the third interlayer bonding layer 725.

In some exemplary embodiments, in order to secure a space where the vibration sound elements 702 and 703 vibrate, the digitizer 740 may not overlap with the vibration sound elements 702 and 703 and may be spaced apart from the vibration sound elements 702 and 703.

Figure 17:
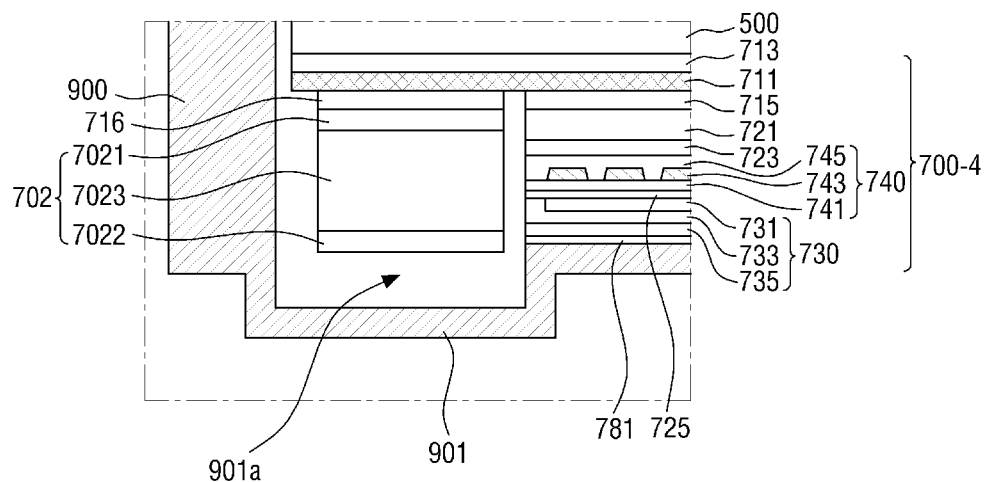
FIG. 17 is a cross-sectional view illustrating still another modification of FIG. 6.
Figure 18:
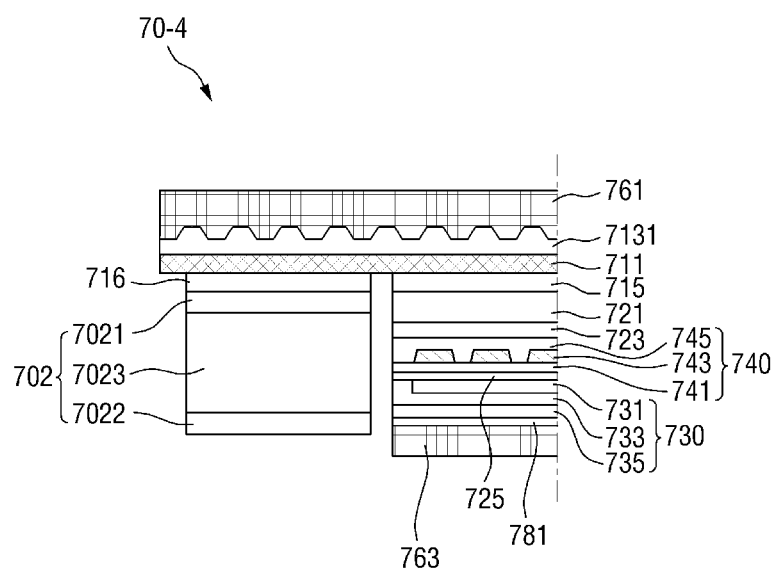
FIG. 18 is a cross-sectional view illustrating still another modification of FIG. 10.

FIG. 17 is a cross-sectional view illustrating still another modification of FIG. 6 and FIG. 18 is a cross-sectional view illustrating still another modification of FIG. 10. There is the largest difference from the exemplary embodiments of FIGS. 6 and 10 in that the panel bottom member 700-4 illustrated in FIG. 17 and the panel bottom member 70-4 illustrated in FIG. 18 further include a digitizer 740 and a third interlayer bonding layer 725 and the first vibration sound element 702 is bonded to the light absorbing member 711 by the medium of a separate bonding member 716, and other configurations are substantially the same as or similar to each other.

The description of the digitizer 740 and the third interlayer bonding layer 725 is the same as those described above in the description of FIGS. 15 and 16, and the description for the bonding member 716 is the same as those described above in the description of FIGS. 11 and 12. Accordingly, the detailed description will be omitted.

Figure 19:
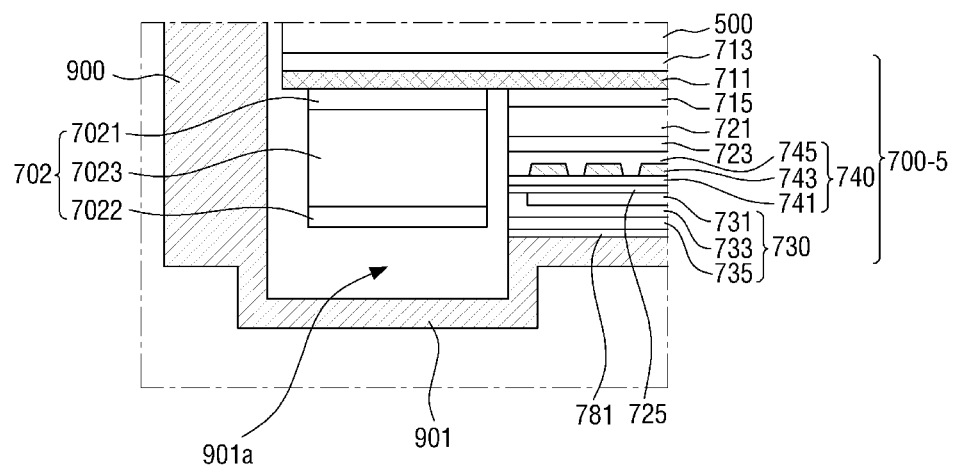
FIG. 19 is a cross-sectional view illustrating still yet another modification of FIG. 6.
Figure 20:
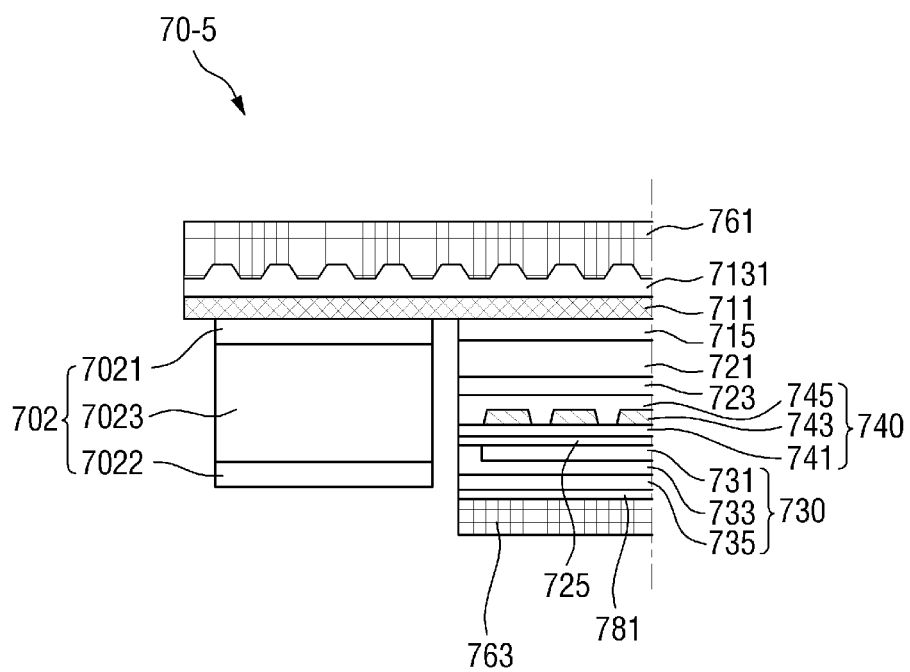
FIG. 20 is a cross-sectional view illustrating still yet another modification of FIG. 10.

FIG. 19 is a cross-sectional view illustrating still yet another modification of FIG. 6 and FIG. 20 is a cross-sectional view illustrating still yet another modification of FIG. 10. There is the largest difference from the exemplary embodiments of FIGS. 6 and 10 in that the panel bottom member 700-5 illustrated in FIG. 19 and the panel bottom member 70-5 illustrated in FIG. 20 further include a digitizer 740 and a third interlayer bonding layer 725 and the first vibration sound element 702 directly contacts the lower surface of the light absorbing member 711, and other configurations are substantially the same as or similar to each other.

The description of the digitizer 740 and the third interlayer bonding layer 725 is the same as those described above in the description of FIGS. 15 and 16, and the description for the bonding member 716 is the same as those described above in the description of FIGS. 13 and 14. Accordingly, the detailed description will be omitted.

Figure 23:
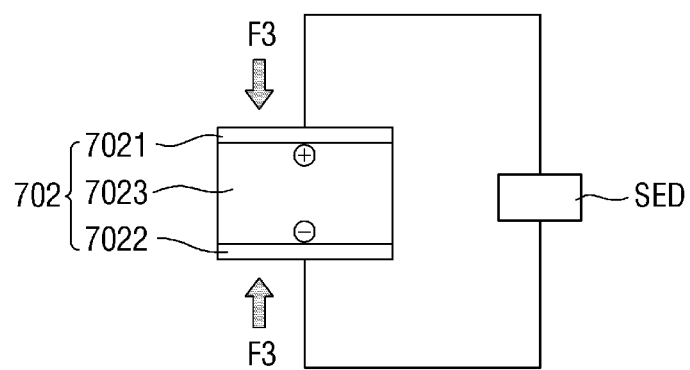
FIG. 23 is a schematic diagram for describing another characteristic of the vibration sound element.

FIG. 23 is a schematic diagram for describing another characteristic of the vibration sound element.

When the first vibration sound element 702 is described as an example, the vibration material layer 7023 generates a sound while vibrating by an electric field. However, when the vibration material layer 7023 vibrates by external force F3 and the like without an electric field, the voltage is generated from the vibration material layer 7023 by an piezoelectric effect. In addition, the generated voltage may be used to transmit sound information to the display device 1 (refer to FIG. 1) and position information of an object located outside the display device 1.

In an exemplary embodiment, when the first vibration sound element 702 is a microphone, sound waves originating from the outside of the display device 1 may induce vibration in the display panel 500, and the vibration is transmitted to the vibration material layer 7023 to generate a voltage, for example. In addition, the generated voltage may be used to transmit sound information to the display device 1.

In some exemplary embodiments, a sensor SED capable of sensing the voltage generated from the vibration material layer 7023 may be additionally provided.

Figure 24:
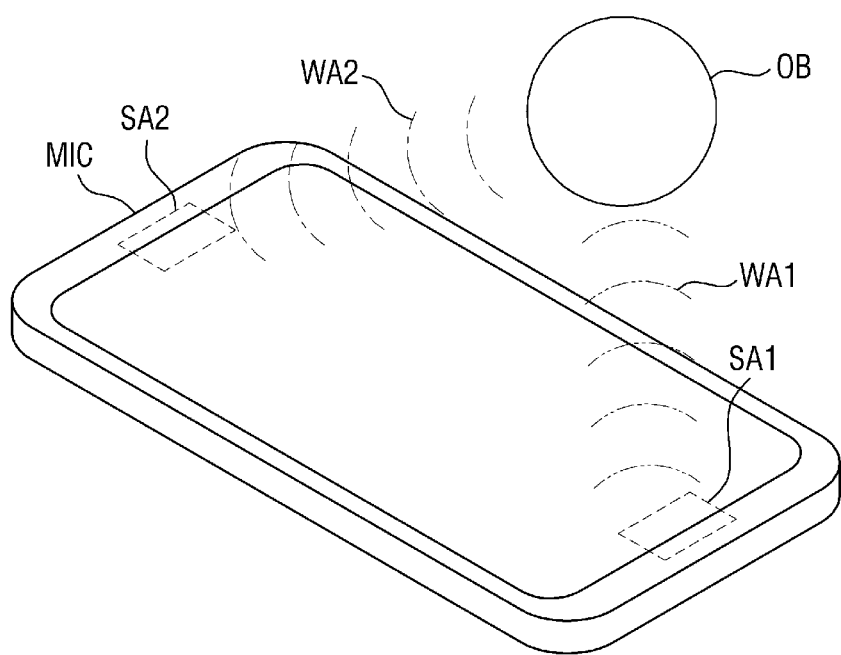
FIG. 24 is a diagram for describing an exemplary embodiment of a proximity sensing operation of the display device according to the invention.

FIG. 24 is a diagram for describing a proximity sensing operation of the display device according to an exemplary embodiment of the invention.

Referring to FIG. 24, when the first vibration sound element 702 (refer to FIG. 4) positioned in the first element area SA1 of the display device 1 generates a high-frequency or low-frequency sound wave WA1 which is not an audible frequency, the generated sound wave WA1 is reflected by an object OB outside the display device 1 such as a user. In addition, a sound wave WA2 reflected by the object OB may induce vibration in a display panel or the like and the induced vibration is transmitted to the second vibration sound element 703 (refer to FIG. 4) positioned in the second element area SA2.

In addition, the vibration material layer of the second vibration sound element 703 (refer to FIG. 4) vibrates by the vibration transmitted to the second vibration sound element 703 (refer to FIG. 4) to generate a voltage. In addition, whether to be close to the object OB may be sensed by using the generated voltage.

In alternative exemplary embodiments, when the display device 1 includes a separate microphone MIC, the sound wave WA2 reflected by the object OB may be sensed by using the microphone MIC and whether to be close to the object OB may also be sensed by using the sensed sound wave.

That is, the display device 1 according to the exemplary embodiment may embody not only a speaker function but also a proximity sensing function by using the vibration sound element without a separate proximity sensor, and further embody various functions such as a microphone function. In addition, there is no need to form a separate hole in the display panel 500 (refer to FIG. 4) for displacement of the proximity sensor, and there is an advantage that the manufacturing process of the display device 1 is simplified.

In addition, when the display device 1 includes the first vibration sound element 702 (refer to FIG. 4) and the second vibration sound element 703 (refer to FIG. 4), the operation of each vibration sound element may be varied according to the operation of the display device 1.

In an exemplary embodiment, when the display device 1 performs a calling operation, any one of the first vibration sound element 702 (refer to FIG. 4) and the second vibration sound element 703 (refer to FIG. 4) has a speaker function for generating sound and the other one may perform a microphone function, for example.

Further, when the display device 1 performs an image reproduction operation or an audio reproduction operation, both the first vibration sound element 702 (refer to FIG. 4) and the second vibration sound element 703 (refer to FIG. 4) may also perform the speaker function.

Further, when the display device 1 performs an operation of receiving a touch input, at least one of the first vibration sound element 702 (refer to FIG. 4) and the second vibration sound element 703 (refer to FIG. 4) may also perform a function of generating the vibration, that is, a haptic function in response to the touch input.

According to the exemplary embodiments of the invention, it is possible to a display device having a sound function and a panel bottom member for the display device having the sound function.

The effects of the invention are not limited to the aforementioned effects, and various other effects are included in the specification.

In the above description, the invention has been described based on the exemplary embodiments, but the exemplary embodiments are for illustrative, and do not limit the invention, and those skilled in the art will appreciate that various modifications and applications, which are not exemplified in the above description, may be made without departing from the scope of the essential characteristic of the aforementioned exemplary embodiments. Each component described in detail in the exemplary embodiment can be modified and executed, for example. Therefore, it should be construed that contents associated with the combination and modification are included in the scope of the invention.

What is claimed is:

1. A panel bottom member, comprising:
    a light absorbing member;
    a top bonding layer which is positioned on the light absorbing member and directly contacts an upper surface of the light absorbing member;
    a first vibration sound element which is positioned below a lower surface of the light absorbing member, bonded to the light absorbing member and configured to vibrate in response to a sound signal to generate a sound corresponding to the sound signal;
    a buffer member which is positioned below the lower surface of the light absorbing member and does not overlap with the first vibration sound element;
    an interlayer bonding layer which is positioned between the lower surface of the light absorbing member and the buffer member; and
    a heat dissipation member positioned below the buffer member,
    wherein the interlayer bonding layer directly contacts the first vibration sound element, the buffer member and the lower surface of the light absorbing member,
    wherein the heat dissipation member does not overlap with the first vibration sound element,
    wherein the heat dissipation member includes:
        a first heat dissipation layer positioned below the buffer member;
        a second heat dissipation layer positioned below the first heat dissipation layer; and
        a bonding layer disposed between the first heat dissipation layer and the second heat dissipation layer, and
    wherein the first heat dissipation layer is smaller than the second heat dissipation layer such that a side of the first heat dissipation layer is positioned inside a side of the second heat dissipation layer.

2. The panel bottom member of claim 1,
    wherein the interlayer bonding layer is further positioned between the light absorbing member and the first vibration sound element and the first vibration sound element is bonded to the light absorbing member by a medium of the interlayer bonding layer.

3. The panel bottom member of claim 1, further comprising:
    a bonding member spaced apart from the first vibration sound element.

4. The panel bottom member of claim 3,
    wherein the bonding member includes a double-sided bonding tape.

5. The panel bottom member of claim 1,
    wherein the first vibration sound element includes a first electrode, a second electrode, and a vibration material layer positioned between the first electrode and the second electrode, and
    the vibration material layer includes at least one of a piezoelectric material, a piezoelectric film, and an electroactive polymer.

6. The panel bottom member of claim 1, further comprising:
    a second vibration sound element which is positioned below the light absorbing member and does not overlap with the buffer member.

7. The panel bottom member of claim 1,
    wherein the light absorbing member includes a substrate and a first light absorbing layer which is disposed on an upper surface or lower surface of the substrate and overlaps with the first vibration sound element,
    wherein the substrate is made of an organic material,
    wherein the first light absorbing layer is made of a black ink, and
    wherein the interlayer bonding layer directly contacts the substrate or the light absorbing member.

8. The panel bottom member of claim 7,
    wherein the light absorbing member further includes a second light absorbing layer overlapping with the first vibration sound element, the first light absorbing layer is disposed on the upper surface of the substrate, the top bonding layer is disposed on an upper surface of the first light absorbing layer, the second light absorbing layer is disposed on the lower surface of the substrate, and the interlayer bonding layer and the first vibration sound element are disposed below the second light absorbing layer.

9. The panel bottom member of claim 1, wherein an upper surface of the top bonding layer has an embossed shape.

10. The panel bottom member of claim 1, further comprising:
a digitizer positioned between the buffer member and the heat dissipation member and overlapping with the light absorbing member, wherein the digitizer does not overlap with the first vibration sound element.

11. A display device, comprising:
a display panel; and
a panel bottom member disposed below the display panel, wherein the panel bottom member includes a light absorbing member positioned below the display panel,
a top bonding layer which is positioned between an upper surface of the light absorbing member and the display panel, attached to the upper surface of the light absorbing member and a lower surface of the display panel and directly contacts the upper surface of the light absorbing member and the lower surface of the display panel;
a first vibration sound element which is positioned below a lower surface of the light absorbing member, bonded to the light absorbing member and configured to vibrate in response to a sound signal to generate a sound corresponding to the sound signal;
a buffer member which is positioned below the lower surface of the light absorbing member and does not overlap with the first vibration sound element;
an interlayer bonding layer positioned between the lower surface of the light absorbing member and the buffer member; and
a heat dissipation member positioned below the buffer member,
wherein the interlayer bonding layer directly contacts the first vibration sound element, the buffer member and the lower surface of the light absorbing member,
wherein the heat dissipation member does not overlap with the first vibration sound element,
wherein the heat dissipation member includes a first heat dissipation layer positioned below the buffer member; a second heat dissipation layer positioned below the first heat dissipation layer; and a bonding layer disposed between the first heat dissipation layer and the second heat dissipation layer, and
wherein the first heat dissipation layer is smaller than the second heat dissipation layer such that a side of the first heat dissipation layer is positioned inside a side of the second heat dissipation layer.

12. The display device of claim 11, further comprising:
a diaphragm which outputs the sound in response to a vibration of the first vibration sound element, wherein the diaphragm is a part of the display panel.

13. The display device of claim 11, wherein the display device includes a display area and a non-display area, wherein at least a part of the first vibration sound element is positioned in the display area.

14. The display device of claim 11, wherein the panel bottom member further includes a digitizer which is positioned between the buffer member and the heat dissipation member and overlaps with the light absorbing member, wherein the digitizer does not overlap with the first vibration sound element.

15. The display device of claim 11, wherein the display panel includes a base substrate, a self-light emitting element positioned on the base substrate, and an encapsulation layer positioned on the self-light emitting element, and the panel bottom member is positioned below the base substrate.

16. The display device of claim 15, wherein the base substrate includes a polymer material having flexibility.

17. The display device of claim 11, further comprising:
a bracket positioned below the panel bottom member, wherein the bracket does not contact with the first vibration sound element.

18. The display device of claim 17, wherein the bracket includes a first protrusion which protrudes downward, overlaps with the first vibration sound element, and forms a first resonation space.

19. The display device of claim 17, further comprising:
a bottom bonding member which is positioned between the panel bottom member and the bracket and bonds the panel bottom member and the bracket,
wherein the first vibration sound element does not overlap with the bottom bonding member.

20. The display device of claim 11, wherein the panel bottom member further includes a second vibration sound element which is positioned below the light absorbing member and does not overlap with the buffer member.

21. The display device of claim 20, wherein a sound wave having a frequency other than an audible frequency emitted from the first vibration sound element is reflected by an object and the second vibration sound element senses the sound wave reflected by the object to sense whether to be close to the object.

22. The display device of claim 20, further comprising:
a bracket which is disposed below the panel bottom member and includes a first protrusion and a second protrusion protruding downward, wherein the first protrusion forms a first resonation space therein, the second protrusion forms a second resonation space therein, the first protrusion overlaps with the first vibration sound element, and the second protrusion overlaps with the second vibration sound element.

* * * * *